United States Patent
Yabe et al.

[11] Patent Number: 5,783,134
[45] Date of Patent: Jul. 21, 1998

[54] METHOD OF RESIN-SEALING SEMICONDUCTOR DEVICE

[75] Inventors: Isao Yabe; Masahiko Yoneyama; Teruo Nayuki; Hiroaki Shimizu; Katsuhiko Ikai; Kazuhiko Asaumi, all of Tanashi, Japan

[73] Assignee: Citizen Watch Co., Ltd., Tokyo, Japan

[21] Appl. No.: 522,244

[22] PCT Filed: Jan. 6, 1995

[86] PCT No.: PCT/JP95/00007
§ 371 Date: Sep. 7, 1995
§ 102(e) Date: Sep. 7, 1995

[87] PCT Pub. No.: WO95/19251
PCT Pub. Date: Jul. 20, 1995

[30] Foreign Application Priority Data

| Jan. 13, 1994 | [JP] | Japan | 6-002055 |
| Jan. 18, 1994 | [JP] | Japan | 6-003365 |
| Apr. 28, 1994 | [JP] | Japan | 6-091961 |
| May 25, 1994 | [JP] | Japan | 6-111314 |

[51] Int. Cl.⁶ ............................................. B29C 45/02
[52] U.S. Cl. ........................ 264/272.14; 264/272.15; 264/272.17; 264/277
[58] Field of Search ................ 264/161, 272.14, 264/272.15, 272.17, 275, 277, 328.8, 328.9, 276; 425/116, 544

[56] References Cited

U.S. PATENT DOCUMENTS

| 4,954,308 | 9/1990 | Yabe et al. | 264/272.17 |
| 4,961,893 | 10/1990 | Rose | 264/272.15 |
| 5,071,334 | 12/1991 | Obara | 264/272.15 |
| 5,215,759 | 6/1993 | Juskey et al. | 264/272.15 |
| 5,286,426 | 2/1994 | Rano, Jr. et al. | 264/272.15 |
| 5,302,805 | 4/1994 | Hara | 264/272.17 |
| 5,344,795 | 9/1994 | Hashemi et al. | 264/272.17 |
| 5,370,517 | 12/1994 | Casati et al. | 264/272.17 |
| 5,424,251 | 6/1995 | Sono et al. | 264/272.17 |
| 5,444,909 | 8/1995 | Mehr | 264/272.17 |
| 5,510,074 | 4/1996 | Rose | 264/272.15 |
| 5,563,103 | 10/1996 | Komatsu | 264/272.17 |

FOREIGN PATENT DOCUMENTS

| 51-137377 | 11/1976 | Japan. |
| 59-154032 | 9/1984 | Japan. |
| 5-293846 | 11/1993 | Japan. |

*Primary Examiner*—Angela Y. Ortiz
*Attorney, Agent, or Firm*—Kanesaka & Takeuchi

[57] ABSTRACT

In a method of resin-sealing a semiconductor device having a circuit board with an IC thereon, a metal mold formed of upper and lower metal molds is prepared. The upper metal mold has a pressing member, and the lower metal mold has a cavity for mounting the circuit board therein, a pinpoint gate formed at a lower portion of the cavity and a runner section formed below the cavity and communicating with the pinpoint gate. The circuit board is positioned in the cavity of the lower metal mold, and is set such that the IC faces downward. A rear surface of the circuit board where the IC is not mounted is pressed by the pressing member, and a resin is filled in the cavity through the runner section and the pinpoint gate to thereby seal the IC mounted on the circuit board by the resin.

21 Claims, 8 Drawing Sheets

METHOD OF RESIN-SEALING SEMICONDUCTOR DEVICE

BACKGROUND OF THE INVENTION

[Field of the Invention]

The present invention relates to a method of resin-sealing semiconductor device, comprising a circuit board with an IC mounted thereon, with thermoset resin, and, in particular, to a pinpoint gate method suitable for a transfer mold, whereby the resin is fed from below by a plunger.

[Description of the Prior Art]

Resin-sealed semiconductor devices with a plurality of electrodes have been developed in recent years as the high density mounting of IC chips progresses. A typical example of such a device is a PGA (pin grid array). The PGA has a circuit board with an IC chip mounted on one of the surfaces and sealed with resin and a plurality of pins positioned on the other surface and connected to the IC chip. Although the PGA has the advantage of being dismountably installed on a mother board, its size is large because of the existence of the pins and it is difficult to make it small.

Accordingly, a pad array carrier (hereinafter referred to as a PAC), whereon a pad is provided in place of the pins, has been developed as a small semiconductor device sealed with resin to replace the PGA.

However, sealing the semiconductor device with resin involves the risk of cutting wires due to poor mobility of molten resin. Thermoplastic resins are unsuitable for this application because the reliability of the seal after fabrication is poor. Therefore, thermoset resins which exhibit good mobility, high forming precision and reliability after sealing are used.

For molding a thermoset resin, a side gate system has been quite widely adopted as a gate system used for the resin forming metal mold, rather than a pinpoint gate system.

Normally, when a thermoset resin is molded using the side gate system, a sealed section 61 is formed by filling a cavity 55 with a thermoset resin 58 which has passed through a gate 60, as shown in FIG. 14. After the thermoset resin 58 has hardened, an upper metal mold 54 is separated from a lower metal mold 51, and an IC module 63 with a sealed section 61 formed thereon is removed together with the runner resin.

When the removed IC module 63 is separated from the runner resin, a gate remnant 64 connected to the sealed section 61 is formed as shown in FIG. 15. Therefore, it is necessary to remove the gate remnant 64. However, there is the problem that when the gate remnant 64 is removed a wiring pattern is destroyed, cracks are produced in the resin forming the sealed section, and the surface of the circuit board is contaminated with resin because the resin from the gate section runs onto and hardens on the surface of the circuit board.

For this reason, the pinpoint gate system which can eliminate the problems associated with the side gate system has been adopted for forming the PAG with thermoset resin.

However, when the thermoset resin is formed using a metal mold of the pinpoint gate system, the resin tends to plug the gate opening. In order to eliminate this problem, a metal mold which is provided with a runner lock pin for disengaging the resin from the gate opening after molding is used.

This forming method will now be explained with reference to FIG. 16.

A circuit board 53 to which an IC 52 is bonded is set between an upper metal mold (a mounting plate 80, a stripper plate 75, and a cavity block 73) which is heated to a specified temperature, for example, about 165° C., and a lower metal mold (a movable side plate 71). A thermoset resin tablet 81 heated to a specified temperature is fed into a cull section 76 from a pot 82 of a plunger P. Following this, the thermoset resin is caused to flow from the cull section 76 into a cavity 74 through a lateral runner section 77 and a gate section 79 of a vertical runner section 78, by pressing the plunger P.

After the thermoset resin has been filled into the metal mold and held for a specified thermosetting time, for example, about 90 sec, the mold is opened and its engagement with the runner resin is released. Specifically, as shown in FIG. 17, first, the stripper plate 75 and the cavity block 73 are separated, and in order to pull away the runner resin around a stopper section 84 of a runner lock pin 83, the runner resin is cut away in a gate section 79 from the PAC, which is the molded resin product. Next, the runner resin consisting of a cull 86, a lateral runner 87 and a vertical runner 88 is removed from the stopper section 84 of the runner lock pin 83 to the axial direction of the pin, by the movement of the stripper plate 75 in the direction of the arrow F. Then, the mold is opened along a parting line 72 to remove the product PAC.

In this resin molding method, however, when the mold is closed, pressure is applied to the upper surface of the circuit board 53 at the cavity block 73, and at that time, the circuit board 53 is damaged from being strongly pressed by the cavity block 73 and the lower metal mold 71 in the case where the circuit board 53 is thicker than the depth of an indented section 71a formed in the lower metal mold 71. Also, conversely, in the case where the circuit board 53 is thinner than the depth of an indented section 71a, an opening is produced between the cavity block 73 and the circuit board 53 so that resin leaks out of this opening, and a burr is thereby produced. To avoid this, the dimensions of the circuit board 53 must be extremely precise.

Accordingly, in order to adapt a wide variation in dimensions of the circuit board 53, a resin forming method using a mold as illustrated in FIG. 18 has been proposed.

In this resin forming method, the circuit board 53 is mounted and fastened by guide pins 42 of an energized presser section 61 of the lower metal mold 71. The energized presser section 61 is energized by a compressed coil spring 60 to press against the rear surface of the circuit board 53.

At this time, even when the depth of an indented section 61a of the energized presser section 61 is less than the thickness of the circuit board 53 and the upper surface of the energized presser section 61 is apart from the lower surface of the cavity block 73, the variation in the thickness of the circuit board 53 can be absorbed and the upper surface of the circuit board 53 closely adheres to the lower surface of the cavity block 73 so that the resin does not leak from the cavity 74, if there is no obstacle to the action of the energized presser section 61 on a sliding section 62.

However, the energized presser section 61 is easily baked at the sliding section 62 because the mold has been previously heated when sealing with the resin. When this baking of the energized presser section 61 occurs, sliding is prevented and the pressure on the circuit board 53 is inadequate. Because of this, a gap is produced between the circuit board 53 and the cavity block 73 so that the resin leaks out, resulting in a burr being produced. The baking of the sliding section 62 can be prevented when the clearance of the sliding section 62 is increased, but when the clearance is increased the precision of the resin sealing position of the sliding section 62 cannot be ensured.

In addition, at the time of adsorbing the circuit board 53 when the product PAC is mounted and dismounted, a special adsorption pad is required from the necessity of avoiding interference with the upwardly facing loading section of the IC, because the adsorbing space is limited.

Furthermore, the PAC adheres easily to the side of the cavity block 73 when the mold is opened. It is therefore difficult to remove the PAC and extra time is required for one cycle of resin molding.

In addition, because the cavity 74 is located below the vertical runner section 78, residual resin 85, which is produced when the runner resin at the gate section 79 is cut away and when the mold is cleaned, enters the gate section 79 and the cavity 74, as shown in FIG. 17. For this reason, there are various problems, such as imperfect filling of resin in the cavity 74 in the next cycle, bending, cutting and shoulder touching of the bonding wire due to hardened residual resin which entered the cavity.

Accordingly, an object of the pre sent invention is to provide a method of resin-sealing semiconductor device, wherein a circuit board on which an IC is mounted is set so that the IC faces in the downward direction in a cavity in a lower metal mold, and a thermoset resin is fed from below the cavity, without imperfect filling of the resin due to residual resin and without damage to wires, and further wherein the circuit board is mounted and dismounted by means of adsorption on a flat rear surface of the circuit board, enabling pick-up of a plurality of semiconductor devices using a general purpose absorption pad or the like, which ensures high productivity.

A further object of the present invention is to provide a method of resin-sealing whereby it is possible to form a high quality semiconductor device with high reliability, and to solve expected problems such as, for example, unsatisfactory flow of the resin, and unsatisfactory filling of the cavity, by the adoption of a so-called bottom plunger method whereby a thermoset resin is fed from below the cavity.

[Disclosure of the Invention]

In the method of a resin-sealing semiconductor device of the present invention, a circuit board with an IC mounted thereon is positioned in a cavity in a lower metal mold so that the IC faces in the downward direction, and pressure is applied to the rear surface of the circuit board by a pressing member provided in an upper metal mold, to seal the IC mounted on the circuit board with resin. The resin is filled in the cavity from a pinpoint gate, formed in the lower portion of the cavity, through a runner formed below the cavity.

As a result, by means of the present invention, it is possible to eliminate imperfect filling of the resin resulting from the presence of residual resin and to eliminate damage to the wires, thus increasing the reliability. Also, a general purpose absorption pad can be used for mounting and dismounting the circuit board.

Further, in the method of a resin-sealing semiconductor of the present invention, a forming device comprising a plurality of pots, runners, pinpoint gates, and cavities are used, the plurality of pots being positioned in almost a straight line, with the cavities being positioned at equal intervals on both sides of each pot, to seal the circuit with resin. In addition, each IC of a plurality of ICs mounted on one board respectively corresponds to and is mounted in the cavities positioned on one side of each pot of the plurality of cavities, then the circuit board is sealed with resin.

As a result, resin sealing using a multiplunger is possible in the method of the present invention, which enables so-called pick-up of a plurality of resin-sealed semiconductor devices, thereby improving the productivity.

In addition, in the method of a resin-sealing semiconductor device of the present invention, a plunger can be provided for applying pressure to a resin tablet fed from a pot, and when the upper metal mold and the lower metal mold are closed, the resin tablet is charged from the pot so as to cause the upper end of the resin tablet to come contact with the upper surface of a cull section of the lower metal mold, and in this state, after a certain preheat time, the plunger is pressed to introduce the molten resin into the cavity and to seal the circuit board.

At this time, pressure is applied to the plunger during a first interval until the softened resin almost fills the inside of the runner section, and during a second interval in which the resin flows into the cavity, the first interval being set shorter than the second interval, as required, to seal the circuit board with resin.

As a result, by means of the present invention, the resin tablet softens uniformly with good efficiency, and, in addition, the softened resin flows quickly through the runner and gently in the cavity. This prevents imperfect filling of the cavity and production of wire flow and breaking of the cull, so that it is possible to obtain a high quality semiconductor device.

In addition, in the resin-sealing semiconductor device of the present invention, the parting line of the cavity is open for a period during the first interval, and the parting line of the cavity is normally closed during the second interval, when the circuit board on which the ICs are mounted is sealed with resin. Then, the parting line of the cavity is opened for the entire period of the first interval during which the softened resin almost fills the inside of the runner.

As a result, the method of the present invention allows air compressed inside the cavity to escape from the mold. Therefore, there is no creation of bubbles, burrs, or the like in the semiconductor device on which the resin is formed, making it possible to obtain a highly reliable semiconductor device with a good outer appearance.

DETAILED DESCRIPTION OF THE PREFERRED EMBODIMENTS

Preferred embodiments of the present invention will now be explained in detail with reference to the drawings.

First, a metal mold used to implement the resin sealing method of the present invention will be illustrated with reference to FIG. 1 to FIG. 3.

Figure 1:
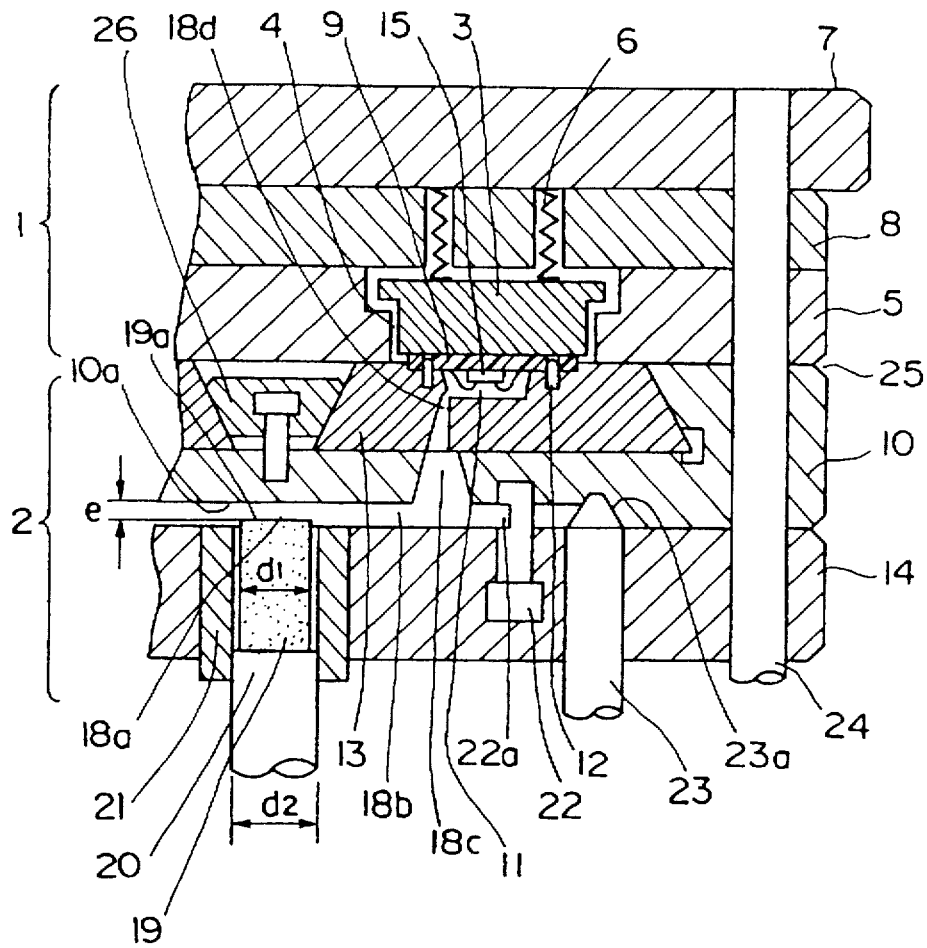
FIG. 1 is a sectional view of the principal parts of an example of a metal mold used when implementing the method of the present invention.

As shown in FIG. 1, this metal mold comprises an upper metal mold 1 and a lower metal mold 2. The upper metal mold 1 comprises a fixed side mounting plate 7, a heat insulating member 8 for preventing heat from reaching the fixed side mounting plate 7, and a fixed side mold plate 5. The lower metal mold 2 comprises a first movable side mold plate 10, a second movable side mold plate 14, as well as a movable side receiving plate, a spacer, and a movable side mounting plate, none of which are shown in the drawing, combined in that order with the lower section of the second movable side mold plate 14. A circuit board 9 on which is mounted an IC 15 is provided with a positioning guide hole 9a as shown in FIG. 3.

An energized presser section 3 has a plane surface which applies pressure to the rear surface of the circuit board 9, and is maintained on the fixed side mold plate 5 so as to slide in a slide section 4. A compressed coil spring 6 which acts as an energizing means for applying pressure to the energized presser section 3 is housed in the heat insulating member 8. A spring member such as plate spring, or an elastic member such as a synthetic rubber or the like, can be used in place of the compressed coil spring 6 as an energizing means.

Figure 2:
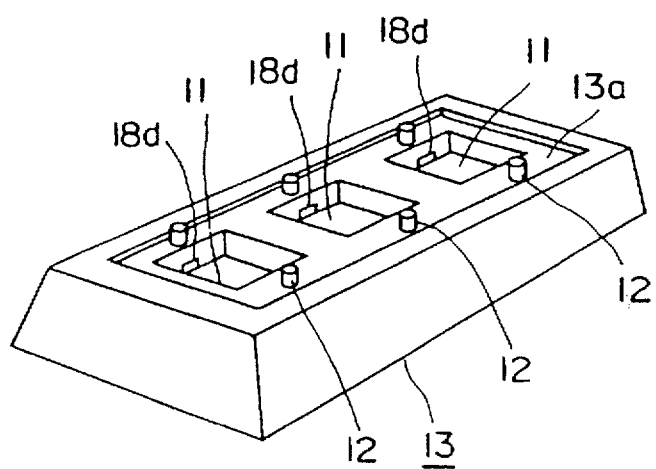
FIG. 2 is a perspective view of a cavity block shown in FIG. 1.
Figure 3A:
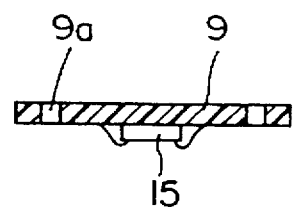
FIG. 3(a) is a sectional view of a circuit board with an IC mounted thereon.
Figure 3B:
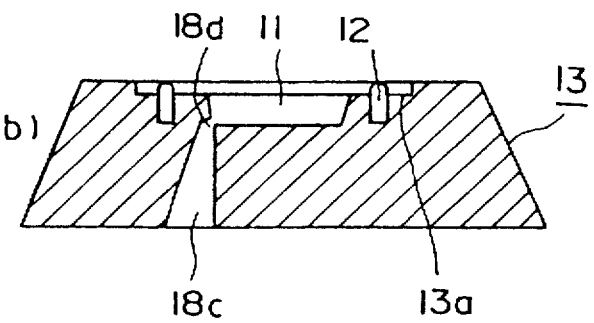
FIG. 3(b) is a sectional view of a cavity block shown in FIG. 2.

A cavity block 13, as shown in FIG. 2 and FIG. 3(b), is a cassette type with a trapezoid-shaped cross-section, and is insertedly positioned in a freely removable manner in the first movable side mold plate 10. An indented section 13a which is thinner than the circuit board 9 is formed in the cavity block 13. A pair of guide pins 12 corresponding to the cavity which functions as an IC sealing section is provided in three locations on indented section 13a.

As shown in FIG. 1, a runner section 18 (18a, 18b, 18c, 18d) is a resin transfer passage formed by the first movable side mold plate 10 and the second movable side mold plate 14. The runner section 18 comprises a cull section 18a into which a resin tablet 19 is fed, a lateral runner section 18b which radially extends from the cull section 18a, a vertical runner section 18c which arises from the lateral runner section 18b toward the cavity 11, and a gate section 18d.

The gate section 18d is a resin feed port for the cavity 11 which is positioned at the top end of the vertical runner section 18c connecting the cavity 11 and the lateral runner section 18b located below the cavity 11.

A pot 21 is provided at the center of the second movable side mold plate 14 to guide a plunger 20 which applies pressure to the resin tablet 19.

A runner lock pin 22 is secured to the second movable-side mold plate 14. A notch section 22a opened in one section of the outer periphery of the runner lock pin 22 intersects the lateral runner section 18b and forms a part of the sidewall of the lateral runner section 18b, becoming a stopper section for the runner resin hardened in the runner section 18.

Figure 4:
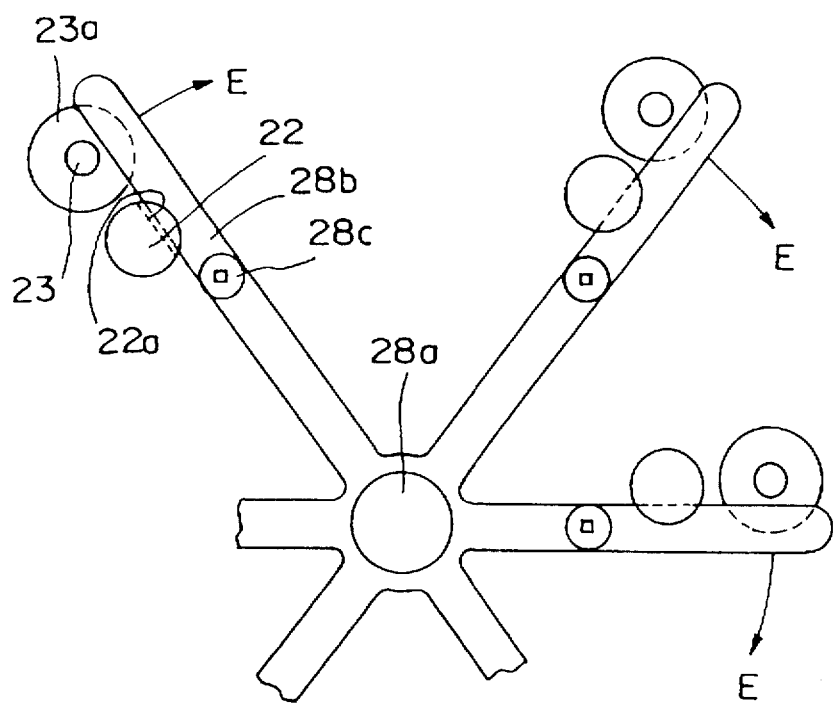
FIG. 4 is a plan view showing the relation among the runner resin and the runner lock pin and the runner lock disengaging pin.

In the case of a metal mold in which cavities are formed at six locations around the cull section 18a, the notch section 22a, which is the stopper section for the runner lock pin 22, faces in the same rotational direction (E), centered around the cull section 18a, as shown in FIG. 4.

A runner lock disengaging pin 23 is provided so that it penetrates the second movable-side mold plate 14 and projects from inside the bottom of the spacer. An inclined surface section 23a at the forward end of the pin 23 is positioned to correspond to each runner lock pin 22 of the runner section 18 so that the inclined surface section 23a forms a part of a side wall at the side where the runner lock pin 22 engages. An ejector pin for the metal mold can be utilized as the runner lock disengaging pin 23. In such a case, it is unnecessary to provide a runner lock disengaging pin independently from the ejector pin for the metal mold so that it is possible to avoid a complicated metal mold.

A guide post 24 guides the upper metal mold 1 and the lower metal mold 2. A parting line 25 is formed between the upper metal mold 1 and the lower metal mold 2.

Two cavity blocks 13 are placed point-symmetrically with respect to the cull section 18a and perpendicularly with respect to the cross section so that these contact a wall surface of the first movable-side mold plate 10 (not shown on the drawing) or a stopper in the form of a pin, and are mounted simultaneously by fastening bolts of a member 26 between the two cavity blocks 13, as shown in FIG. 1. As a result, a resin transfer path which is seamless and has no undercut is formed without a gap from the vertical runner section 18c of the first movable side mold plate 10 to the gate section 18d of the cavity block 13.

Next, a preferred embodiment of the resin-sealing method for a semiconductor device of the present invention using a mold with the above-described structure will be explained.

First, a metal mold heated to a specific temperature, for example about 165° C., is opened, and, after the circuit board 9 is installed in the cavity block 13 of the lower metal mold 2 by mating the guide hole 9a and the guide pin 12 so that the IC 15 faces in the downward direction, the mold is closed such that the energized presser section 3 of the upper metal mold 1 presses against the rear surface of the circuit board 9.

The metal mold made up of the first movable side mold plate 10 and the second movable side mold plate 14 are separated and a preheated thermoset epoxy resin tablet 19 is fed from the pot 21 formed in the lower metal mold 2. Next, the metal mold is closed and pressure is applied by pressing the plunger 20. As a result, the molten epoxy resin is filled into the cavity 11 by pressure, from the cull section 18a formed below the plunger 20 via the lateral runner section 18b, the vertical runner section 18c, and the gate section 18d, so that the IC 15 is sealed with resin.

In this manner, because the resin is injected into the cavity 11 from the runner section 18 formed in the bottom of the cavity 11, no residual resin, which is produced when the resin is cut away at the gate section 18d or the metal mold is cleaned, enters the cavity 11. Therefore, there is no occurrence of imperfect filling and breaking or damage of the bonding wire due to clogging with the residual resin.

After the thermoset resin has been filled and held for a specified heat curing time, for example, about 90 sec, the first movable side mold plate 10 and the second movable side mold plate 14 are opened, and the runner resin maintained on the side of the second movable side mold plate 14 is separated from the formed resin in the gate section by the action of the runner lock of the runner lock pin 22. In this instance, the lateral runner resin filled in the lateral runner section 18b is reliably held on the side of the second movable side mold plate 14 by the stopper section 22a of the runner lock pin 22.

Figure 5:
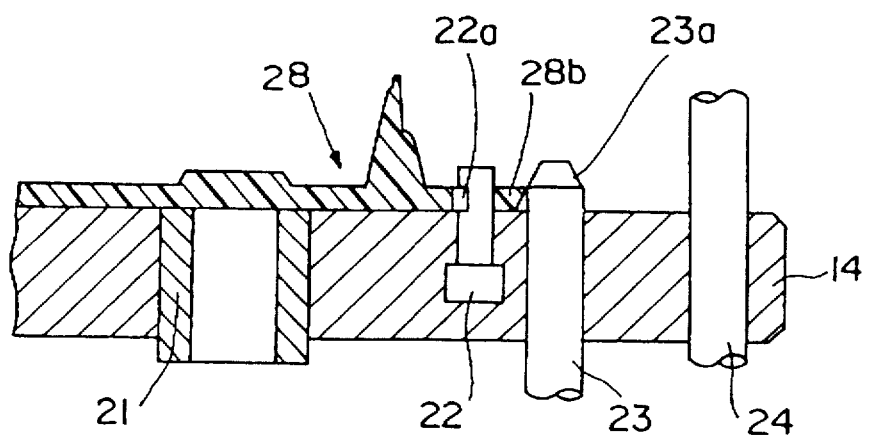
FIG. 5 is a sectional view for explaining the action when the runner resin is removed.

Next, when the runner lock disengaging pin 23, which is a means for pushing out the runner resin, is pushed out, as shown in FIG. 5, the inclined surface section 23a formed on the runner lock disengaging pin 23 presses against a lateral runner resin 28b, and, as shown in FIG. 4, provides rotational force on the runner resin 28b in the direction indicated by the arrow E, centered around the cull 18a. Engagement between the runner resin 28b and the stopper section 22a of the runner lock pin 22 is thereby released. Following this, the runner resin 28b is taken out by a robot which is not shown in the drawing.

In this manner, the runner resin 28 can be reliably and easily removed.

Next, the upper metal mold 1 and the lower metal mold 2 are separated along the parting line 25 to remove the semiconductor device which is the resin-sealed product. The semiconductor device is on the top of the rear surface of the circuit board 9 and has a flat shape, and therefore can be easily removed with an absorption means such as a general purpose absorption pad, optionally applying a light air jet. Because the flat rear surface of the circuit board is positioned on the top even when the circuit board 9 is mounted on the guide pin 12 of the cavity block 13, the operation is simple.

The removal of the semiconductor device may also be carried out prior to the removal of the runner resin.

In addition, the runner resin can be removed without using the runner lock disengaging pin, for example, by providing the pick-up robot with a pair of parallel rods in a claw configuration, which is capable of holding vertical runner of the runner resin to provide rotational force on the runner resin.

The clearance between the energized presser section 3 and the fixed-side mold plate 5 at the slide section 4 can be increased because this has no bearing on the sealing position precision. Accordingly, the operation of the slide section 4 is smooth because no baking occurs by heating during formation, ensuring effective pressing of the circuit board 9. Therefore, even when there is a variation in the thickness and a change in the dimensions of the circuit board 9, specifically, a change in the thickness of the circuit board, such a change or variation is absorbed, and therefore no burrs are created. Because the surface of the energized presser section 3 in contact with the circuit board 9 may be flat, a common form may be used regardless of the type of circuit board 9. Furthermore, the compressed coil spring 6 which is the energizing means is housed in the heat insulating member 8, therefore it does not deteriorate from the heat during molding, and its function can be maintained over a long period.

The cassette-type cavity block 13 can retain three circuit boards. It is possible to simultaneously seal ICs 15 mounted on a larger number of circuit boards. In the case of a strip of three series of circuit boards, it is possible to have only two (one pair of) guide pins. The indented section 13a which may be thinner than the circuit board 9, formed so as to guide the outside of the circuit board 9, can be used in place of the guide pin 12 as the positioning section of the circuit board 9.

The type of circuit board 9 can be switched by simply exchanging the cavity block 13 to correspond to the switched type. This exchange can be performed quickly because the cavity block 13 is the cassette type.

Because the guide pin 12 which is the positioning section of the circuit board 9 and the cavity 11 which is the sealing section are set into one cavity block 13, the positioning accuracy of the sealing section of the circuit board 9 is extremely well ensured.

Figure 6:
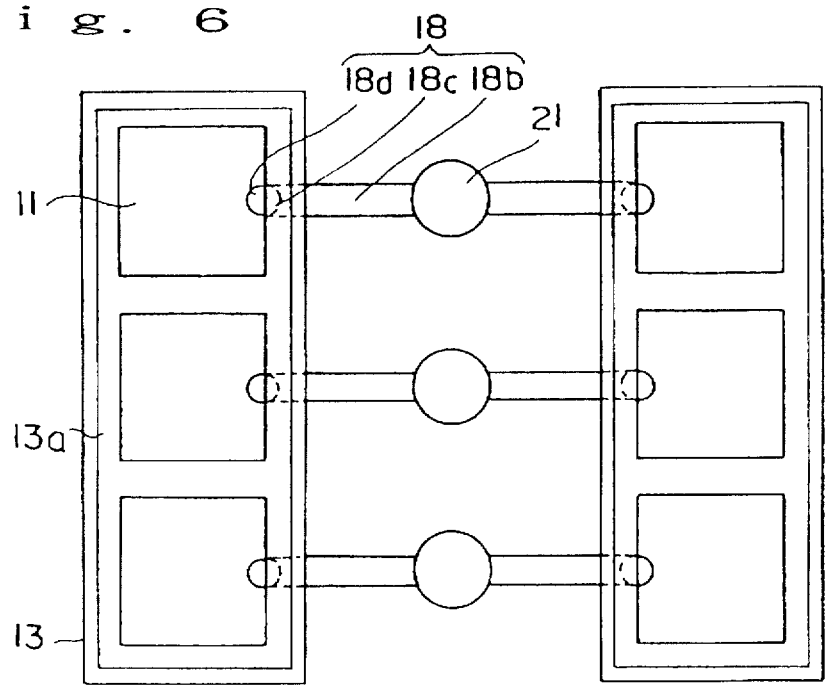
FIG. 6 is a plan view for explaining the positional relationship between a pot and the cavity block in the mold.
Figure 7:
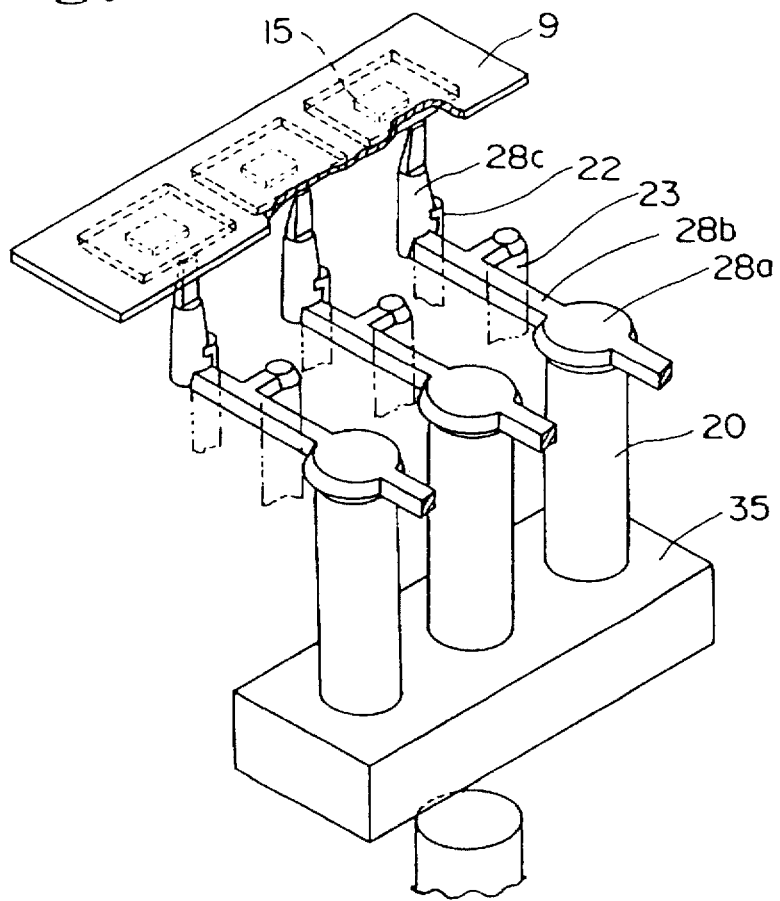
FIG. 7 is a perspective view showing the state of the runner resin when sealed using the mold shown in FIG. 6, and the state of the plunger.

Molds other than those described above can be used. For example, as shown in FIG. 6, a plurality of pots 21 (three in the drawing) can be provided, the pots being positioned in a straight line, together with a plurality of cavities 11, each cavity positioned equidistant from the two sides of the pot. Then, by connecting each pot 21 and the cavities 11 on both sides with runner sections 18 of the same length, resin can be filled simultaneously into each cavity 11. In this case, simultaneous filling of the resin can be performed more accurately by installing the plungers 20 for inserting the resin tablet 19 on the same plunger mounting plate 35a as shown in FIG. 7.

Also, if a plurality of cavities 11 is formed in a straight line on one cavity block 13 in this mold so as to enable corresponding ICs 15 mounted on one circuit board 9 to be inserted therein, the resin sealing of the ICs 15 on the one circuit board 9 can be performed simultaneously, to provide uniformity in the semiconductor device products. The use of this type of resin sealing method ensures production of a great number of semiconductor devices in one lot, giving rise to an increase in productivity.

The method of feeding the resin used in the resin sealing method for a semiconductor device as described above will now be explained in detail.

The thermoset resin for sealing the IC 15 is fed from the pot 21 in the form of a resin tablet 19.

In this case, if the resin tablet 19 is fed without preheating outside of the mold, the following types of phenomena occur.

Specifically, at the point where the plunger 20 is pressed so that the upper end of the resin tablet 19 comes in contact with the metal mold, the resin tablet fed begins to melt from the lower end section 19b already in contact with the plunger 20 and the molten resin flows toward the cavity 11.

However, when the plunger 20 is further pressed and when the resin at the lower end is melted but at the upper end is not completely melted, the molten resin at the lower end runs through a gap between the resin tablet 19 and the inner wall of the pot 21, for example, as shown in FIG. 1, through a narrow gap of about 0.5 mm on one side, which is a difference between the diameter of the resin tablet 19, $d_1=16$ mm, and the diameter of the plunger 20, $d_2=17$ mm, from the bottom to the top. This causes a sudden heat reaction on the inside of the pot 21, and when the plunger 20 is pushed in for about 20 sec, the temporarily molten resin hardens and does not flow as far as the cavity 11, thereby creating imperfect filling. On the other hand, when the velocity of the plunger is high enough to complete the filling operation before softening is commenced, the bonding wire may flow.

Figure 8:
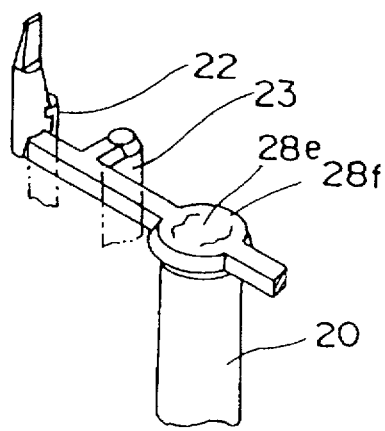
FIG. 8 is a perspective view showing an example of unsatisfactory goods which could be produced depending on the feed mode of the resin.

In addition, because the upper end of the resin does not flow but only the lower end flows, a layer is formed between a cull section center 28e of the runner resin 28 and a cull section periphery 28f after the resin has cured, as shown in FIG. 8. This layer is easily broken and causes the cull to break when the mold is opened. The runner section may be taken up by the upper metal mold due to the cull breaks, making it impossible to continue the forming operation.

A highly reliable method for resin sealing overcoming these problems, which is suitable for the application of a transfer mold by the bottom plunger method, providing excellent precision of the resin sealing and well adaptable to automatic feeding of the resin tablet, will now be explained.

Figure 9:
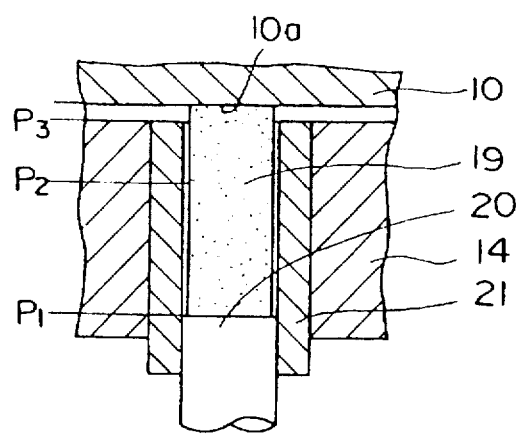
FIG. 9 is a view showing the relationship between a cull section and the plunger, for explaining the feed mode of the resin.

Specifically, to feed the resin tablet 19, the unheated resin tablet 19 is rapidly fed into the pot 21 by means of an automatic feeding device which has been omitted from the drawing while the first movable side mold plate 10 and the second movable side mold plate 14 are opened, then the first movable side mold plate 10 and the second movable side mold plate 14 are closed. At this time, a bottom dead point $P_1$ of the plunger 20 is preset so that the upper end of the resin tablet 19 contacts a cull section upper surface 10a of the first movable mold plate 10. In this embodiment, the bottom dead point $P_1$ of the plunger 20 (see FIG. 9) is positioned, for example, 40 mm below the cull section upper surface 10a.

Next, the resin tablet 19 is uniformly softened by being held for a normal preheat time of, for example, 10 to 15 sec (a=15 sec in FIG. 10), while the upper end of the resin tablet 19 is in contact with the cull section upper surface 10a of the first movable side mold plate 10.

When the plunger 20 is activated without providing a certain preheat time while the upper end of the resin tablet 19 fed is in contact with the cull section upper surface 10a of the first movable side mold plate 10, as mentioned above, the resin tablet 19 is softened also at the upper end and the resin can flow. However, because the resin tablet 19 is not uniformly softened, bonding wire flowing may occur to some extent.

The plunger 20, therefore, should be pressed after a certain preheat interval has passed. It is possible to cause the molten resin rapidly to reach the gate section 18d by rapidly pushing the plunger 20 in a first interval I, specifically, the interval wherein the molten resin tablet 19 fills out the runner section 18 made up of the lateral runner section 18b and the vertical runner section 18c, for example, at a velocity of b=5 sec for a 20 mm distance from a point $P_1$ to a point $P_2$ (in FIG. 10).

Figure 10:
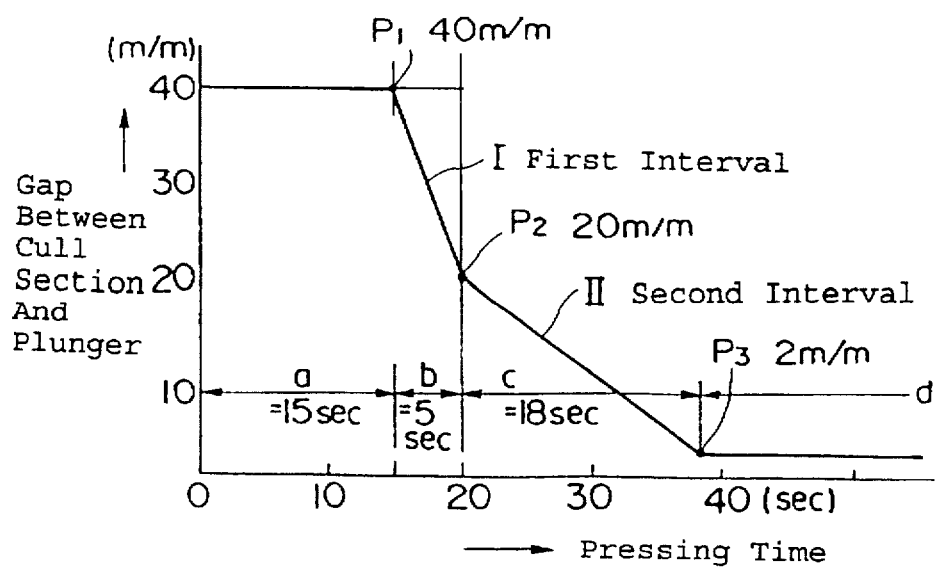
FIG. 10 is a timing chart for explaining the feed mode of the resin.

Further, it is possible to reliably fill out the cavity 11 with the molten resin without the occurrence of wire-flow in the bonding wire by further pressing the plunger 20 slowly in a second interval II, the interval wherein the resin passing through the gate section 18d fills out the cavity 11, for example, being at a velocity of c=18 sec for the 18 mm distance from the point $P_2$ to a point $P_3$ (FIG. 10).

Accordingly, the gap between the top dead point $P_3$ of the plunger 20 and the cull section upper surface 10a of the first movable side mold plate 10 which forms the lower metal mold 2 stays at about 2 mm, for example, equivalent in thickness to the cull of the formed resin. Then, the plunger 20 is caused to descend after sufficient time has passed for the resin to begin to harden (equivalent to d in FIG. 10), while this 2 mm gap is left.

Specifically, in this method, the resin tablet 19 is first uniformly softened by being held for a certain preheat time while the upper end of the resin tablet 19 which has been fed is kept in contact with the cull section upper surface 10a of the first movable side mold plate 10. Then, the velocity of the plunger 20 for pushing forward the molten resin during the first interval I, in which the runner section 18 is filled with the molten resin pushed out from the pot 21 while the resin tablet 19 fed has not been completely hardened, is set faster than the velocity of the plunger 20 during the second interval II in which the cavity 11 is filled. In this embodiment, the preheat time is set at 15 sec; in the first interval I it takes 5 sec for the plunger 20 to be moved 20 mm; and in the second interval II it takes 18 sec for the plunger to move 18 mm.

As outlined above, the bottom dead point $P_1$ of the plunger 20, the preheating time of the resin tablet 19, and the velocity of the plunger 20 during the first and second intervals, are set appropriately from time to time taking into consideration the components and dimensions of the resin tablet 19, the temperature of the forming mold, and the volume of the runner section 18 and the cavity 11.

Accordingly, because the plunger 20 is pressed when the resin tablet 19 has been completely and uniformly softened at both the upper end and the lower end, no layer is formed between the resin-formed cull center and the cull periphery. Thus, there is no possibility that a part of the runner resin 28 cannot be removed from the upper metal mold due to cull break when the metal mold is opened, thereby ensuring smooth molding operation. Also, as mentioned above, no imperfect filling or wire flowing of the bonding wire occurs.

Figure 11:
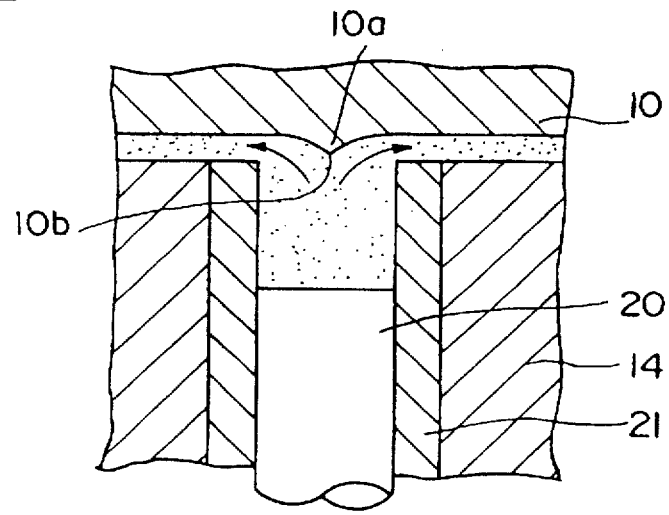
FIG. 11 is view showing the shape of the cull section for regulating the flow of the resin.

FIG. 11 shows a mold with a resin flow guidance section 10b having a protruding cone shape in the stopper section of the resin tablet 19 of the cull section upper surface 10a of the first movable mold plate 10. This structure ensures the flow of the soft, molten resin to be regulated along the resin flow guidance section 10b when the plunger 20 is pressed, and enables the resin to flow smoothly through the runner section 18 into the cavity 11.

Resin tablets can be handled in its original solid state using the resin sealing method for a semiconductor device as explained above. It is therefore possible to apply an automatic feeding device with good efficiency. In addition, the resin tablet can be uniformly softened with good efficiency by preheating for a specified period of time while the upper and lower end surfaces of the resin tablet is in contact with the mold, after feeding it to the metal mold and closing it. In addition, because the velocity of the plunger is varied so that the resin flows quickly through the runner section during the period when the resin is melted but not still hardened and flows slowly in the cavity, no imperfect filling of the cavity, wire flowing, or breaking of the cull occurs.

Next, a method for performing the above-described method for resin-sealing semiconductor device while removing air from inside the mold will be explained.

Figure 12:
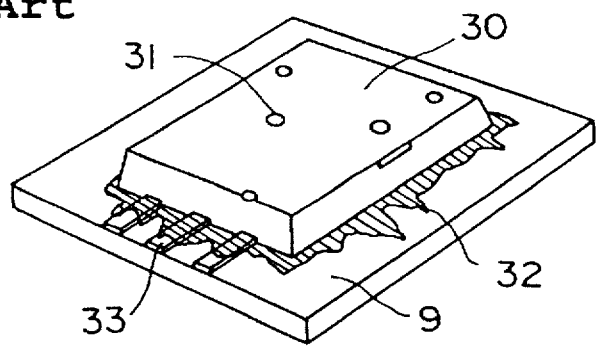
FIG. 12 is a perspective view showing an example of unsatisfactory goods which could be produced depending on the feed mode of the resin.

In the above-described method, when the plunger 20 is pressed, the molten resin flows through the lateral runner section 18b, the vertical runner section 18c, and the gate section 18d, into the cavity 11 while compressing air in the runner section 18. At this time, the pressure applied by the plunger 20 causes air to be compressed and accumulate in the cavity 11. If this compressed air is not removed from the mold, bubbles 31 are left in the mold, in the sealed section 30, as shown in FIG. 12. A semiconductor device containing air bubbles 31 of this type is adversely affected by the ambient environment, for example, by humidity.

Accordingly, in order to remove air compressed by the action of the plunger 20 from the mold, the parting line 25 on the cavity 11 side is opened so that the energized presser section 3 and the circuit board 9 are separated, for example, by about 10 μm. This arrangement may cause air to escape out of the mold from the gap between the circuit board 9 and the cavity block 13 when pressure is applied to the plunger 20. However, when the resin sealing is performed with the parting line 25 left open, the molten resin is forced out of the sealing section 30 and flows onto the surface of the circuit board 9, so that, as shown in FIG. 12, a so-called burr 32 is produced. The burr 32 may result in inadequate conductance in a pattern 33, poor spreading of the solder, and peeling of the resin.

Accordingly, illustrated now is a method for overcoming these problems, which is suitably applied to a transfer mold of the bottom plunger method, while providing superior resin sealing quality and ensuring highly reliable resin sealing.

As mentioned above, when the charged resin tablet 19 is uniformly softened the plunger 20 is pressed at a high velocity in the first interval I until the runner section 18 is almost filled with the molten resin so as to cause the resin to reach a point just before the gate section 18d. In this instance, air in the runner section 18 is compressed and is confined to the cavity 11.

Figure 13:
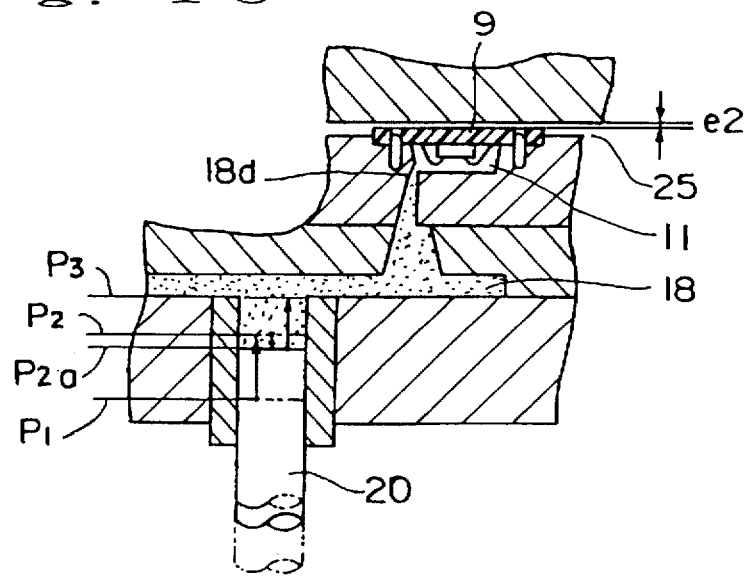
FIG. 13 is a sectional view for explaining the mode for feeding the resin while extracting compressed air.
Figure 14:
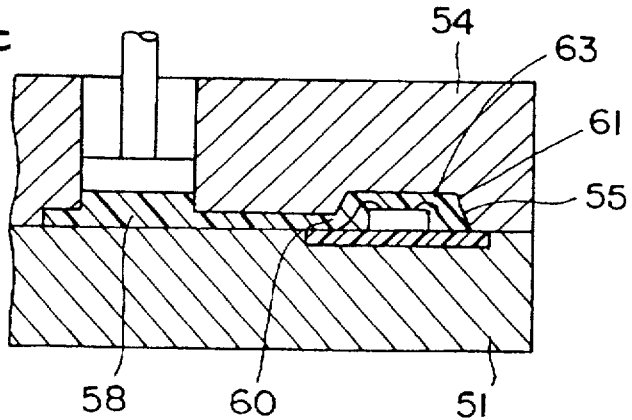
FIG. 14 is a sectional view for explaining the method of forming a semiconductor device using a conventional side gate method.
Figure 15:
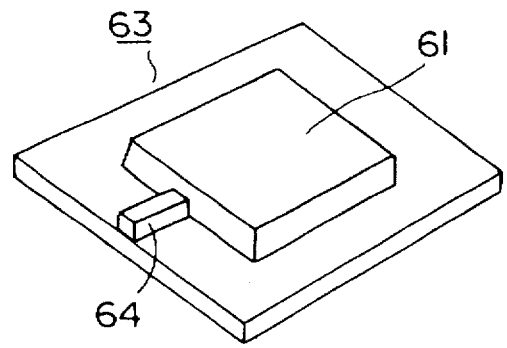
FIG. 15 is a perspective view of a semiconductor device formed by the method shown in FIG. 14.
Figure 16:
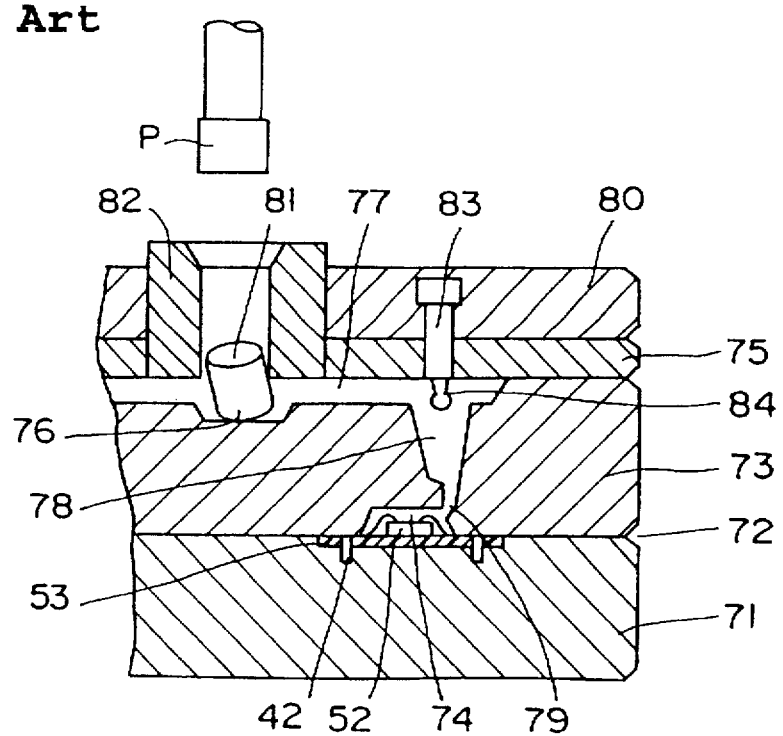
FIG. 16 is a sectional view for explaining a method of forming a semiconductor device using a conventional pinpoint gate method.
Figure 17:
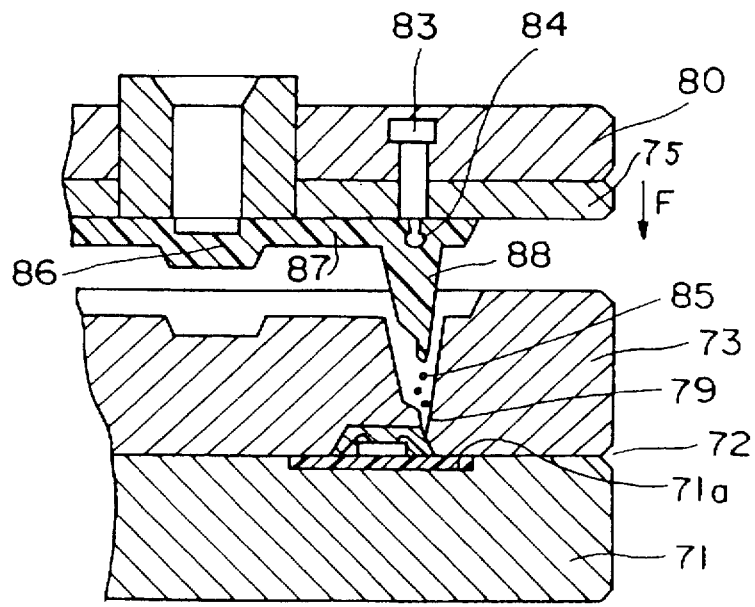
FIG. 17 is a sectional view for explaining a method for cutting away runner resin from formed goods in the forming method shown in FIG. 16.
Figure 18:
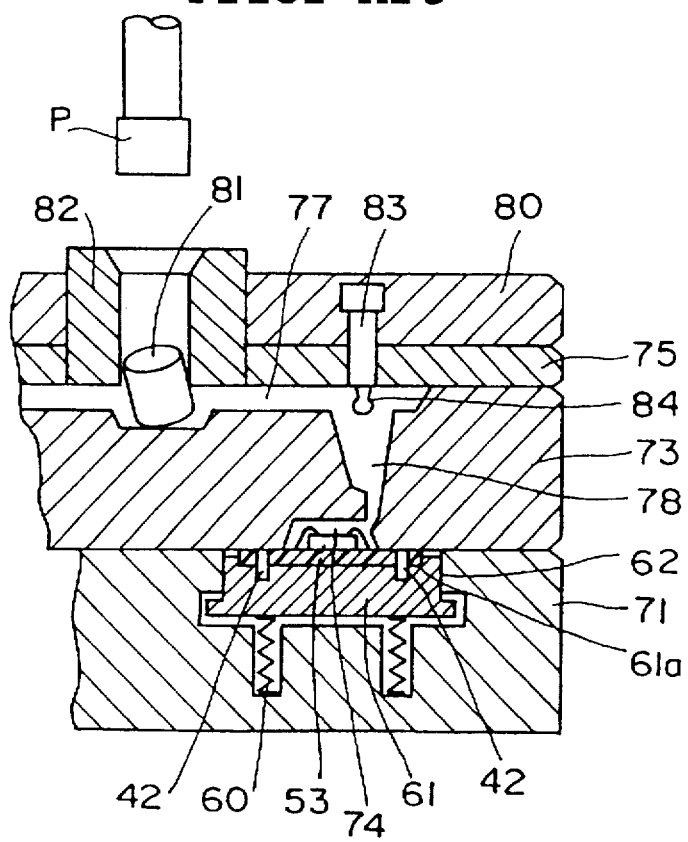
FIG. 18 is a sectional view for explaining a method of forming a semiconductor device using a conventional pinpoint gate method which is an improvement of the method shown in FIG. 16.

Accordingly, the plunger 20 is then halted temporarily at the position $P_2$ and, at this time, a gap e2 in the parting line 25 of the cavity 11 is opened, as shown in FIG. 13. Specifically, the gap, e2=0.5 mm approximately, is opened instantaneously for about 0.2 sec. to release the compressed air in the cavity 11 from the mold.

Next, after the parting line 25 of the cavity 11 is closed, the movement of the plunger 20 resumes, going from the position $P_2$ to the top dead center $P_3$. The plunger 20 is pressed slowly in the second interval II, during which the resin passes through the gate section 18d and flows into the cavity 11. Using this method, the molten resin fills out the cavity 11 without any wire flow of the bonding wire; no bubbles are left in the sealing section; and no burrs are created from the flow of the resin onto the surface of the circuit board 9.

In this example, even though the plunger 20 is halted momentarily at the position $P_2$, pressure is applied to the molten resin so that there will be the case where this resin passes through the gate section 18d and flows into the cavity 11 from its own momentum. In such a case, the plunger 20 is immediately drawn back to the position $P_{2a}$ shown in FIG. 13, after it has been halted momentarily at the position $P_2$, then, the gap e2 in the parting line 25 of the cavity 11 is opened momentarily, thereby releasing the compressed air in the cavity 11.

After the parting line 25 of the cavity 11 side is closed the movement of the plunger 20 resumes. In the second interval from $P_{2a}$ to $P_3$ for flowing the resin into the cavity 11, the plunger 20 is gently pressed.

Beside the above method, the following method can be used to eliminate the compressed air from the cavity 11.

In this method the parting line 25 of the cavity 11 side is opened by the gap e2 to release the compressed air in the cavity 11 from the mold during all or part of the first interval in which the runner section 18 is almost filled with the resin by quickly pressing the plunger 20 from the bottom dead center $P_1$ to $P_2$. The plunger 20 is halted momentarily at the position $P_2$, or is drawn back slightly to the position $P_{2a}$ from the position $P_2$ at which it has momentarily been halted. Following this, in the same manner as in the case described above, the parting line 25 of the cavity 11 side is closed and the plunger 20 goes gently to the top dead center $P_3$.

Using these methods, the molten resin is filled in the cavity 11 more reliably without any wire flow occurring in the bonding wire; no bubbles are left in the sealing section; and no burrs are created from the flow of the resin onto the surface of the circuit board 9.

INDUSTRIAL APPLICABILITY

As illustrated above, the method of resin-sealing semiconductor device of the present invention can be broadly applied to resin-sealing a circuit board with an IC mounted thereon, and, in particular, can be suitably used for a PAC (pad array carrier).

We claim:

1. A method of resin-sealing a semiconductor device having a circuit board with an IC thereon, comprising:

preparing a metal mold formed of an upper metal mold having a pressing member, and a lower metal mold situated under the upper metal mold and having a cavity for mounting the circuit board therein, a pinpoint gate formed at a lower portion of the cavity and a runner section formed below the cavity and communicating with the pinpoint gate, positioning the circuit board in the cavity of the lower metal mold and setting the circuit board such that the IC faces downward, pressing a rear surface of the circuit board where the IC is not mounted by the pressing member, supplying a resin tablet to a pot formed in the lower metal mold and pushing the resin tablet by a plunger from below to feed a resin obtained from the resin tablet to the runner section, filling the resin in the runner section to the cavity from below through the pinpoint gate formed below the cavity, and sealing the IC mounted beneath the circuit board by the resin while absorbing a change of a thickness of the circuit board by the pressing member for pressurizing the rear surface of the circuit board by using a spring.

2. The method of resin-sealing a semiconductor device as claimed in claim 1, wherein the metal mold comprises a plurality of sets, each set having a plurality of pots, runner sections, pinpoint gates, and cavities, and the resin is fed from the pots; and feeding of the resin from the pots to fill the cavities with the resin from the pinpoint gates through the runner sections is simultaneously performed in these sets.

3. The method of resin-sealing a semiconductor device as claimed in claim 2, wherein said plurality of pots are positioned in a straight line in the metal mold, a plurality of cavities are positioned at equal intervals on both sides of each pot, and each pot and the plurality of cavities associated with that pot are connected with runner sections of the equal length, whereby the resin is filled into each cavity simultaneously.

4. The method of resin-sealing a semiconductor device as claimed in claim 3, wherein the cavities positioned on both sides of each pot of the plurality of pots are arranged in straight lines.

5. The method of resin-sealing a semiconductor device as claimed in claim 4, wherein a plurality of ICs mounted on one circuit board is set in each of the cavities arranged in a straight line; and each of the plurality of ICs mounted on the circuit board is sealed with the resin in the respective cavities.

6. The method of resin-sealing a semiconductor device as claimed in claim 1, wherein the cavity for the lower metal mold, a positioning section for positioning the circuit board, and the pinpoint gate are formed in one cavity block; and a circuit board whereon ICs with different shapes are mounted is sealed with resin by switching the cavity block.

7. The method of resin-sealing a semiconductor device as claimed in claim 1, wherein the cavity for the lower metal mold, a positioning section for positioning the circuit board, a part of a vertical runner section, and the pinpoint gate are formed in one cavity block; and a circuit board on which ICs with different shapes are mounted is sealed with the resin by switching the cavity block.

8. The method of resin-sealing a semiconductor device as claimed in claim 1, wherein when the upper metal mold and the lower metal mold are closed, an upper end of the resin tablet charged from the pot abuts against the upper surface of a cull section of the lower metal mold, and after holding the resin tablet in this state for a specified preheat time, the plunger is activated to cause a softened resin to flow into the cavity, thereby sealing the ICs mounted on the circuit board.

9. The method of resin-sealing a semiconductor device as claimed in claim 8, wherein a process of pressing the softened resin by the plunger comprises a first interval up until the runner section is substantially filled and a second interval in which the resin flows into the cavity.

10. The method of resin-sealing a semiconductor device as claimed in claim 9, wherein the softened resin is moved by the plunger at different velocities in the first interval during which the runner is filled with the resin and in the second interval during which the cavity is filled with the resin.

11. The method of resin-sealing a semiconductor device as claimed in claim 10, wherein the velocity of the plunger during the first interval is set at a greater velocity than the velocity of the plunger during the second interval.

12. The method of resin-sealing a semiconductor device as claimed in claim 1, wherein a resin flow induction section is formed at a tablet stopper section on an upper surface of a cull section of the lower metal mold to regulate flow of the resin.

13. The method of resin-sealing a semiconductor device as claimed in claim 12, wherein the resin flow induction section to regulate the flow of the resin is formed with a protruding shape.

14. The method of resin-sealing a semiconductor device as claimed in claim 13, wherein the resin flow induction section to regulate the flow of the resin is formed in a cone shape.

15. The method of resin-sealing a semiconductor device as claimed in claim 9, wherein in the first interval, a parting line for the cavity is opened for a specified time period, and in the second interval the parting line for the cavity is always closed.

16. The method of resin-sealing a semiconductor device as claimed in claim 15, wherein the specified time period during which the parting line for the cavity is opened is within the first interval during which the softened resin substantially fills out the runner section.

17. The method of resin-sealing a semiconductor device as claimed in claim 15, wherein the plunger is temporarily halted between the first interval and the second interval.

18. The method of resin-sealing a semiconductor device as claimed in claim 15, wherein the plunger temporarily stops between the first interval and the second interval, and the plunger retreats after which it proceeds to the second interval.

19. The method of resin-sealing a semiconductor device as claimed in claim 1, wherein the lower metal mold includes a runner lock pin engaging a runner resin which has hardened inside the runner section and means for removing the runner resin from the runner lock pin; a notch section in one part of a periphery of the runner lock pin is positioned so that it intersects the runner section, and the runner resin hardened in the runner section being pushed out in a direction to disengage from the notched section of the runner lock pin.

20. The method of resin-sealing a semiconductor device as claimed in claim 19, wherein a runner lock disengaging pin is used as the removing means; and the runner resin is removed from the notch section of the runner lock pin by the runner lock disengaging pin.

21. The method of resin-sealing a semiconductor device as claimed in claim 1, wherein said lower metal mold includes an exchangeable cavity block having said cavity, said pinpoint gate, said runner section and a depression formed above the cavity, said depression being thinner than the thickness of the circuit board, said circuit board being disposed in the depression and said IC being disposed in the cavity so that when the resin is supplied, the IC mounted on the circuit board and its vicinity are only sealed by the resin.

* * * * *